(12) United States Patent
Christensen et al.

(10) Patent No.: US 9,455,251 B1
(45) Date of Patent: Sep. 27, 2016

(54) DECOUPLING CAPACITOR USING FINFET TOPOLOGY

(71) Applicant: International Business Machines Corporation, Armonk, NY (US)

(72) Inventors: Todd A. Christensen, Rochester, MN (US); John E. Sheets, II, Zumbrota, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/800,430

(22) Filed: Jul. 15, 2015

(51) Int. Cl.
*H01L 27/06* (2006.01)
*H01L 29/78* (2006.01)
*H01L 49/02* (2006.01)

(52) U.S. Cl.
CPC ........... *H01L 27/0629* (2013.01); *H01L 28/82* (2013.01); *H01L 29/785* (2013.01)

(58) Field of Classification Search
CPC .. H01L 27/0629; H01L 28/82; H01L 29/785
See application file for complete search history.

(56) References Cited

U.S. PATENT DOCUMENTS

| 7,060,553 | B2 | 6/2006 | Fried et al. |
| 7,948,307 | B2 | 5/2011 | Chang et al. |
| 8,760,927 | B2 | 6/2014 | Deng |
| 2006/0255389 | A1 | 11/2006 | Maeda |
| 2011/0291166 | A1* | 12/2011 | Booth, Jr. ....... H01L 21/823821 257/296 |
| 2012/0153370 | A1 | 6/2012 | Furuta et al. |
| 2013/0193500 | A1 | 8/2013 | Chen |
| 2013/0270620 | A1* | 10/2013 | Hu .................... H01L 21/76229 257/296 |
| 2013/0307043 | A1 | 11/2013 | Cheng et al. |
| 2014/0183610 | A1 | 7/2014 | Lee et al. |
| 2015/0097220 | A1* | 4/2015 | Ponoth ................ H01L 27/0629 257/296 |

* cited by examiner

*Primary Examiner* — Whitney T Moore
(74) *Attorney, Agent, or Firm* — Patterson + Sheridan, LLP

(57) ABSTRACT

Embodiments herein describe a decoupling capacitor that may include multiple fin and gate structures electrically insulated from a conductor (e.g., a metal layer) by a thin dielectric. The fins and gates may be electrically coupled to a first voltage rail (e.g., $V_{HIGH}$) while the conductor is coupled to a second voltage rail (e.g., $V_{LOW}$). In this manner, the fins and gates in combination form a first "plate" which is electrically insulated from the conductor which forms a second "plate" of a capacitor. In one embodiment, the decoupling capacitor is formed on the same substrate as the finFETs, and thus, can be disposed proximate to the finFETs—e.g., on the same layer in the chip or side-by-side. In one example, at least a portion of the decoupling capacitor and the finFET may be formed using the same fabrication steps.

20 Claims, 6 Drawing Sheets

DECOUPLING CAPACITOR USING FINFET TOPOLOGY

BACKGROUND

The present invention relates to incorporating decoupling capacitance into a fin field effect transistor (FET) structure, and more specifically, to using a fin structure as a decoupling capacitor.

FinFET semiconductor technology provides improved transistor performance versus historic planar FET technologies. However, finFETs have much larger gate capacitances when compared to similar sized planar FETs. This increased gate capacitance can have negative effects on the power supplies used to provide the rail voltages to the finFETs which may cause the rail voltages to droop as the gates are switched. This droop can decrease the switching speed of the finFETs and negatively affect the overall timing of the semiconductor chip.

SUMMARY

According to one embodiment of the present invention, a decoupling capacitor includes a fin disposed on a substrate, where the fin extends in a first direction on the substrate and a gate disposed on the substrate, where the gate extends in a second direction on the substrate substantially perpendicular to the first direction, where at least a portion of the fin is disposed between the gate and the substrate, and where the fin and gate are both coupled to a first DC voltage rail. The decoupling capacitor includes a conductor coupled to a second DC voltage rail, where the fin and gate are both disposed between the conductor and the substrate and a dielectric layer electrically insulating both the gate and the fin from the conductor.

According to another embodiment of the present invention, a method includes forming a dielectric layer on a substrate, where a gate and fin are disposed between the dielectric layer and the substrate, where at least a portion of the fin is disposed between the gate and the substrate, and where the fin extends in a first direction and the gate extends in a second direction substantially perpendicular to the first direction. The method includes forming a conductor on the substrate such that the fin and gate are both disposed between the conductor and the substrate, where the dielectric layer electrically insulates both the gate and the fin from the conductor. The method includes a conductor coupled to a second DC voltage rail, where the fin and gate are both disposed between the conductor and the substrate and a dielectric layer electrically insulating both the gate and the fin from the conductor.

According to another embodiment of the present invention, an integrated circuit that includes a substrate and a decoupling capacitor disposed on the substrate. The decoupling capacitor includes a first fin disposed on the substrate, where the first fin extends in a first direction on the substrate and a first gate disposed on the substrate, where the first gate extends in a second direction on the substrate substantially perpendicular to the first direction, where at least a portion of the first fin is disposed between the first gate and the substrate, and where the first fin and first gate are both coupled to a first DC voltage rail. The decoupling capacitor includes a conductor coupled to a second DC voltage rail, where the first fin and first gate are both disposed between the conductor and the substrate and a dielectric layer electrically insulating both the first gate and the first fin from the conductor. The integrated circuit also includes a finFET which includes a second fin and a second gate, where the second gate is disposed over a portion of the second fin in order to selectively activate a conductive channel in the portion of the second fin in response to a time-varying gate signal.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The increased gate capacitance of finFETs relative to planar FET technologies may cause the rail voltages coupled to the finFETs to droop as the gate voltages change. As mentioned above, this droop can have a negative impact on the timing of the semiconductor circuit—e.g., force the finFETs to operate at slower frequencies that would otherwise be possible. To counter the effects of the gate capacitance, additional decoupling capacitors are coupled to the voltage rails and may be disposed proximate to the finFETs in a semiconductor chip. These decoupling capacitors may take advantage of 3D structures (e.g., fins and gates) which yield large capacitance relative to the amount of real estate used on a semiconductor chip.

In one embodiment, the decoupling capacitor may include multiple fin and gate structures that are electrically insulated from a conductor (e.g., a metal layer) by a thin dielectric. The fins and gates may be electrically coupled to a first voltage rail (e.g., $V_{HIGH}$) while the conductor is coupled to a second voltage rail (e.g., $V_{LOW}$). In this manner, the combination of the fins and gates form a first "plate" which is electrically insulated from the conductor which forms a second "plate" of a capacitor. In one embodiment, the decoupling capacitor is formed on the same substrate as the finFETs, and thus, can be disposed proximate to the finFETs—e.g., on the same layer in the chip or side-by-side. In one example, at least a portion of the decoupling capacitor and the finFET may be formed using the same fabrication steps. For example, the fins in the decoupling capacitor may be shaped and doped at the same time the fins in the finFET are shaped and doped. Moreover, the same material used to form the conductor in the decoupling capacitor may also be used to form electrical contacts to the fins in the finFETs. In this manner, the decoupling capacitor and the finFETs may be formed in parallel.

Figure 1:
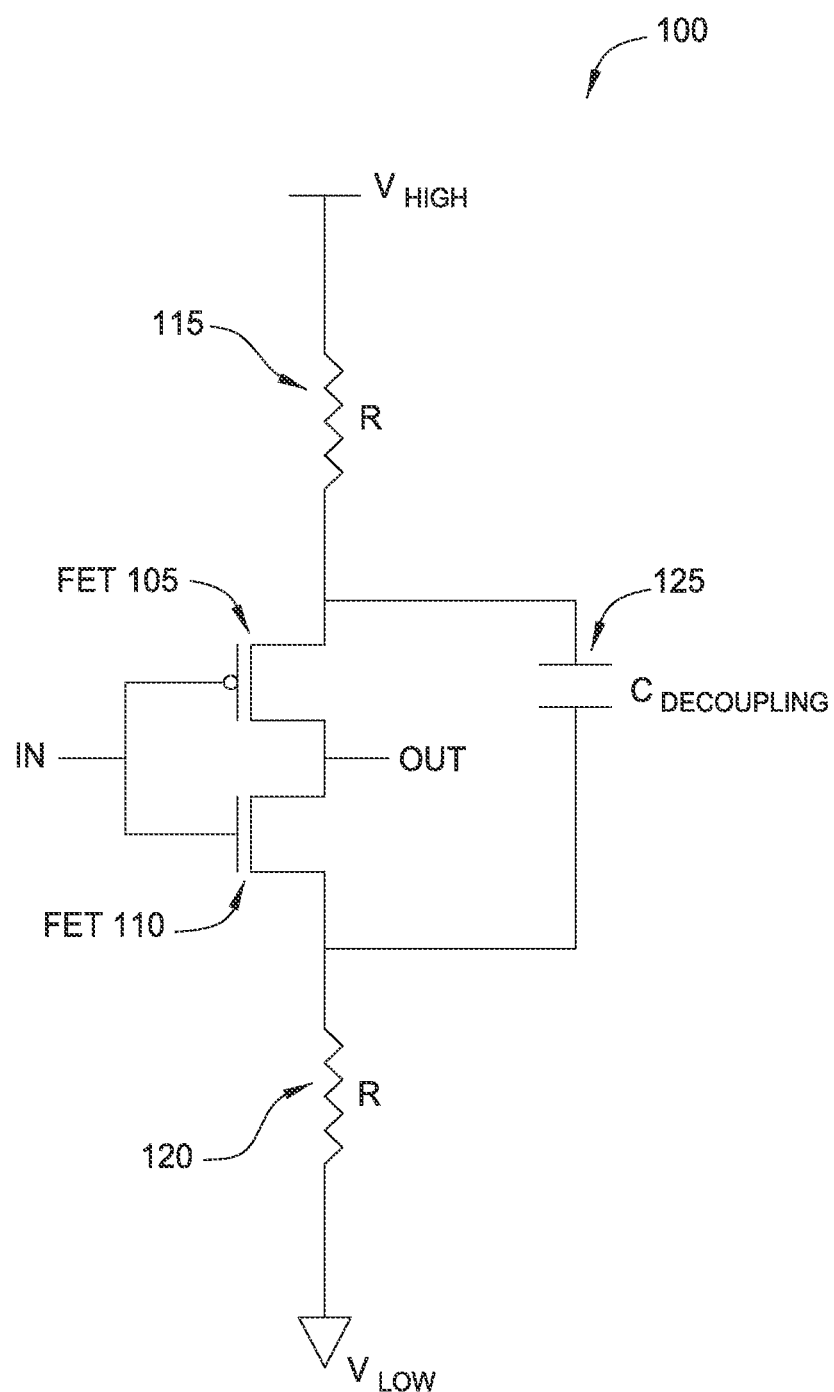
FIG. 1 is a circuit diagram that includes a decoupling capacitor, according to one embodiment.

FIG. 1 is a circuit diagram 100 that includes a decoupling capacitor 125, according to one embodiment. The circuit 100 includes an inverter formed by finFET 105, finFET 110, power path resistances 115 and 120, and decoupling capacitor 125. An IN signal drives the gates of the finFETs 105 and 110 such that the gates voltages are complementary. In this example, FET 105 is a pfinFET while FET 110 is an nfinFET. Thus, when IN is high, finFET 110 is activated (and finFET 105 is deactivated) and the OUT signal is driven to $V_{LOW}$. When IN is low, finFET 105 is activated (and finFET 110 is deactivated) and the OUT signal is driven to $V_{HIGH}$.

The power path resistances 115 and 120 represent the electrical resistance between the power supplies and the FETs 105 and 110. Because the power supplies may be located at a different location on a semiconductor chip (or off the chip) than the FETs 105 and 110, the electrical path between these elements is represented by the resistances 115 and 120. The resistances 115, 120 represent the inherent resistance of the electrical path between the finFETs 105, 110 and the power supplies. For example, the electrical path between the FETs 105, 110 and the power supplies may include different metal layers, electrical vias, traces, and the like which each add some resistance. Because of the power path resistances 115 and 120, the voltage at FET 105 may be less than $V_{HIGH}$, while the voltage at FET 110 may be greater than $V_{LOW}$.

In one embodiment, the finFETS 105 and 110 have respective gate capacitances (i.e., the capacitance between the gate and the fin) which may cause the voltage rails $V_{HIGH}$ and $V_{LOW}$ to droop as the gate voltages switch. To mitigate this droop, the decoupling capacitor 125 is coupled between the voltages rails $V_{HIGH}$ and $V_{LOW}$. Because the capacitor 125 is located at (or near) the same location as the FETs 105, 110 in the chip, the capacitor 125 is not affected by the resistances 115 and 120—i.e., the electrical resistance between the capacitor 125 and the finFETs 105, 110 is small relative to the resistances 115, 120.

The capacitor 125 provides a decoupling capacitance that "decouples" the voltage rails from the noise (i.e., droop) caused by the large gate capacitances of the FETs 105 and 110. To do so, in one embodiment, the capacitor 125 uses its stored charge to maintain the voltage rails close to their desired value by mitigating or preventing the droop caused when the FETs 105 and 110 switch. For example, when the switching FETs 105 and 110 cause the voltage rail to dip, this change in voltage is countered by charge flowing from the capacitor 125. Put differently, the capacitor 125 serves as a secondary (local) power source which can be used to inject or sink current in order to maintain the voltage rails close to $V_{HIGH}$ and $V_{LOW}$.

Figure 2:
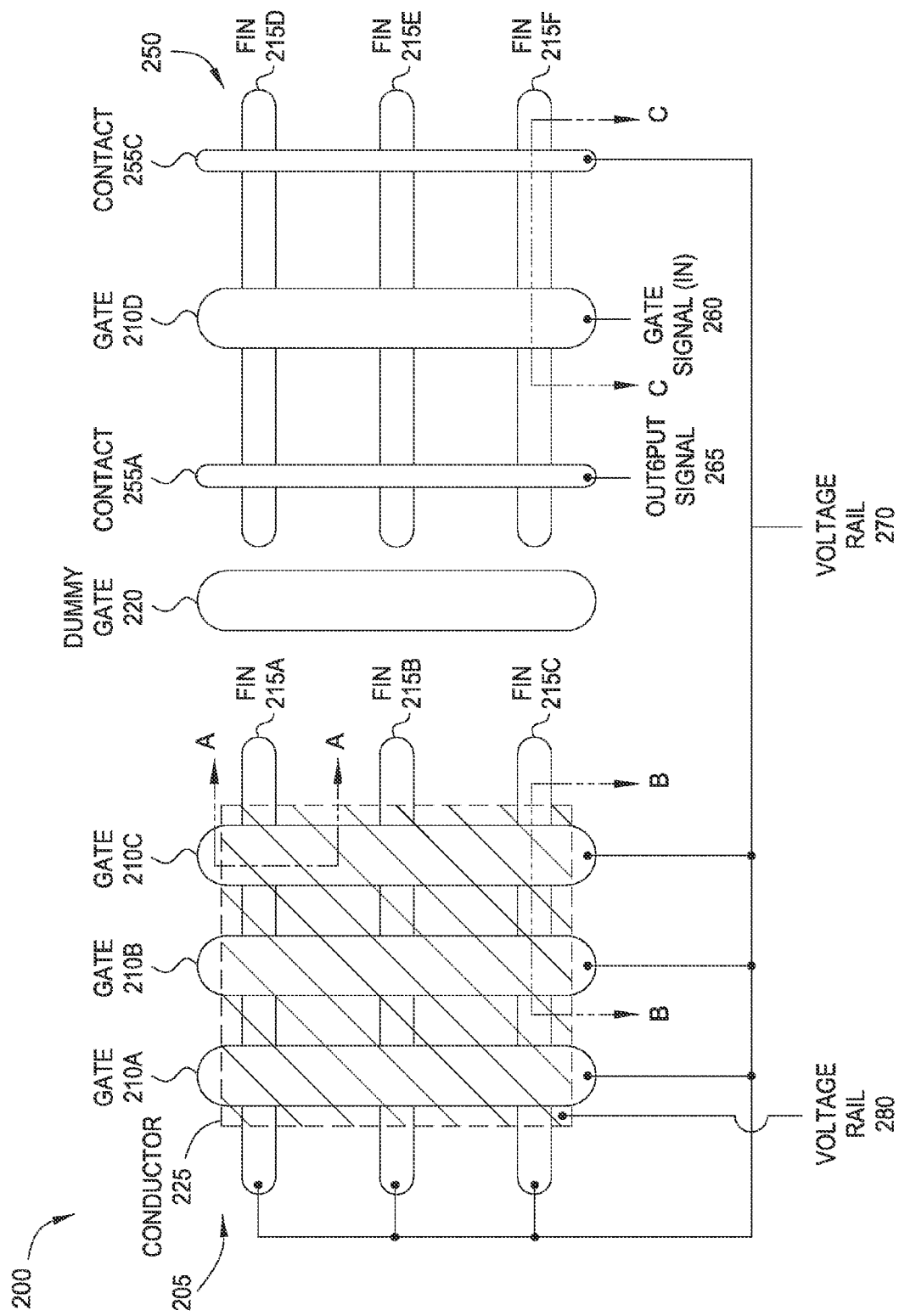
FIG. 2 illustrates a finFET and a decoupling capacitor, according to one embodiment.

FIG. 2 illustrates a semiconductor structure 200 that includes a decoupling capacitor 205 and a finFET 250, according to one embodiment. The structure 200 may be located on a single chip. Furthermore, the decoupling capacitor 205 may be located proximate to the finFET 250 on the chip. For example, the decoupling capacitor 205 may be within one or two microns from the finFET 250, or the capacitor 205 may be side-by-side the finFET 250. In another example, the decoupling capacitor 205 is separated from the finFET 250 by one or more a dummy structures (e.g., dummy gate 220) which are not actively driven using a modulated signal. Advantageously, disposing the decoupling capacitor 205 proximate to the finFET 250 on a chip may improve the ability of the capacitor 205 to improve the voltage droop discussed above. As shown, the decoupling capacitor 205 and the finFET 250 both have at least one structure coupled to the same voltage rail (i.e., voltage rail 270). By minimizing the distance between the decoupling capacitor 205 and the finFET 250, the capacitor 205 is able to better mitigate any voltage droop on voltage rail 270 caused by the finFET 250 switching states.

The decoupling capacitor 205 includes a plurality of fins (i.e., fins 215A-C) that are overlapped by a plurality of gates (i.e., gates 210A-C). In this example, the gates 210 are substantially perpendicular to the fins 215. As used herein, "substantially perpendicular" means the two structures are perpendicular to each other given the limits of fabrication processes used to manufacture the structures. For example, two structures which are substantially perpendicular may intersect to form an angle that is 90 degrees+/−5 degrees.

The gates 210 may be made from silicide, polysilicon, metal, or any other conductive material. The fins 215 may be a crystalline semiconductor such as crystalline silicon. Moreover, the different portions of the fins 215 may be doped differently—i.e., either n-type or p-type. For example, the portions of the fins 215 to the left and right of the gates 210 may have higher dopant concentrations than the portions of the fins 215 underneath the gates 210. However, unlike the finFET 250, the 3D structures in the decoupling capacitor 205 (e.g., the gates 210A-C and fins 215A-C) are not used to perform switching and instead are coupled to the DC voltage rail 270 which drives a constant voltage onto these structures. As such, the fins 215A-C and gates 210A-C in the capacitor 205 can be doped differently than the fins 215D-F and the gate 210D in the finFET 250. For example, the fins 215A-C may be doped uniformly throughout their length. Alternatively, in another embodiment, the fins 215 and gates 210 may have the same dopant profiles regardless of whether they are in the decoupling capacitor 205 or the finFET 250 since doing so may mean that fewer processing steps are needed to form the fin structure 100.

The decoupling capacitor 205 also includes a conductor 225 that is disposed over at least a portion of both the gates 210A-C and the fins 215A-C. The conductor 225 is shown using transparent hatching so that the detail of the underlying gates 210A-C and fins 215A-C can still be seen. Nonetheless, in one embodiment, the conductor 225 is a continuous layer of material deposited above the gates 210A-C and the fins 215A-C. The conductor 225 may be made from any conductive material such as silicide, doped silicon, metal, and the like. Although not shown here, a thin dielectric layer is disposed between the conductor 225 and the gates 210A-C and the fins 215A-C, thereby preventing direct electrical contact between these structures. The conductor 225 is electrically coupled to voltage rail 280 while the gates 210A-C and the fins 215A-C are both coupled to the voltage rail 270. In one embodiment, the voltage rails 270, 280 are coupled to different DC power supplies that output different DC voltages—e.g., $V_{HIGH}$ and $V_{LOW}$. In one embodiment, one of the voltage rails 270, 280 may be a reference voltage—e.g., system ground.

The gates 210A-C, fins 215A-C, and conductor 225 form a capacitance between the voltage rails 270, 280. In this example, the gates 210A-C and fins 215A-C are coupled to the same voltage—i.e., voltage rail 270. In contrast, conductor 225 is coupled to voltage rail 280. Although shown as connecting to the rail 280 at one location, the conductor 225 may connect to the voltage rail 280 at multiple locations. Advantageously, the decoupling capacitor 205 includes many of the same types of structures—e.g., gates 210 and fins 215—as the finFET 250. As such, the decoupling capacitor 205 and the finFET 250 may be fabricated in parallel using many of the same fabrication steps.

The finFET 250 includes contacts 255A and 255B which have direct electrical connections to the underlying fins 215D-F. Because contact 255A couples to each of the portions of the fins 215D-F to the left of gate 210D, these portions of the fins 215D-F are electrically shorted together to form an output signal 265. Because contact 255B couples to each of the portions of the fins 215D-F to the right of gate 210D, these portions of the fins 215D-F may be driven to the same voltage—i.e., voltage rail 270. Moreover, the different portions of the fins 215D-F may be doped differently—i.e., either n-type or p-type. For example, the portions of the fins 215D-F to the left and right of the gate 210D may have higher dopant concentrations than the portions of the fins 215D-F underneath the gate 210D.

In operation, a gate signal 260 drives a voltage onto the gate 210D. Depending on whether the finFET 250 is a pFET or nFET, driving a first voltage on the gate 210D causes the charge carries (e.g., holes or electrons) in the fins 215D-F underneath the gate 210D to form a conductive channel between the left and right portions of the fins 215D-F. When the conductive channel is formed (i.e., the finFET 250 is activated), the left and right portions of the fins 215D-F are electrically connected and the output signal 265 is driven to voltage rail 270. As used herein, the "voltage rails" are constant DC voltages generated by power supplies. In one embodiment, the voltage rails are not intended to vary (although there may be some unintended droops in the voltage as discussed above) in contrast to control signals such as the gate signal 260 which change voltages to activate and deactivate the finFET 250. During other time periods, the gate signal 260 drives a second voltage onto the gate 210D which ensures that no conductive channel is formed in the fins 215D-F (i.e., the finFET 250 is deactivated), thereby preventing current from flowing between the left and right portions. In this scenario, the output signal 265 is electrically floating.

The semiconductor structure 200 also includes a dummy gate 220 which may be used to ensure the chip achieves a predetermined gate density requirement, or to alter a timing characteristic (e.g., coupling capacitance). Doing so may provide a flatter processing surface when fabricating layers disposed above the current layer shown in FIG. 2.

Figure 3A:
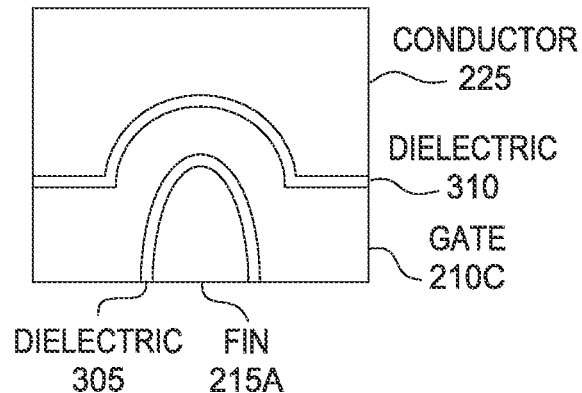
FIGS. 3A-3C illustrate various views of the structures in FIG. 2, according to one embodiment.
Figure 3B:
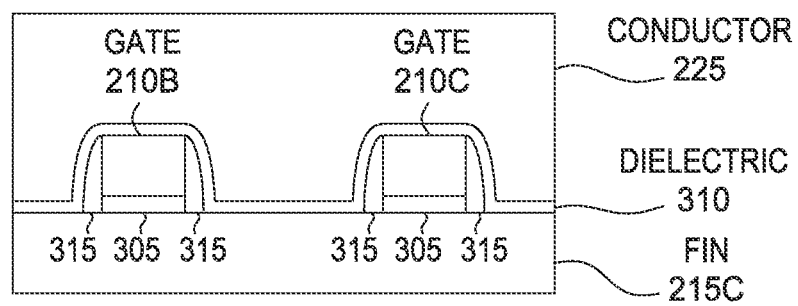
Figure 3C:
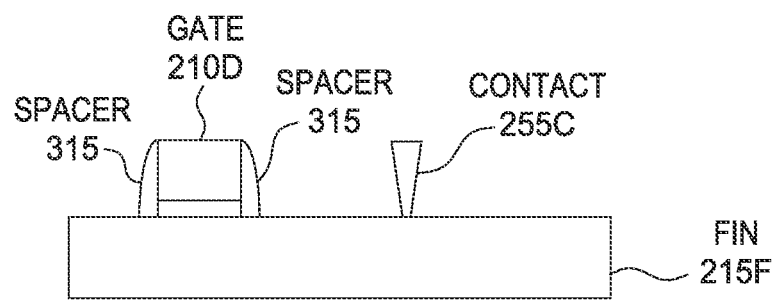

FIGS. 3A-3C illustrate various views of the structures in FIG. 2, according to one embodiment. Specifically, FIG. 3A illustrates the cross section of the decoupling capacitor indicated by A-A in FIG. 2. As shown, the fin 215A (which extends in the direction into and out of the page) is surrounded on three sides by the gate 210C. The fin 215A and gate 210C are separated by a thin dielectric 305 (e.g., a gate oxide). Since in the decoupling capacitor the fin 215A and gate 210C are driven to the same voltage, the dielectric 305 material between the two structures is not necessary—e.g., the fin 215A may directly contact the gate 210C. However, if the decoupling capacitor is formed in parallel with a finFET that does need a dielectric material between the fins and gates, it may be easier to also form the dielectric 305 on the decoupling capacitor since it will have little or no negative effects on its performance.

The decoupling capacitor also includes a dielectric 310 that electrically insulates the conductor 225 from the gate 210C and the fin 215A. Thus, different DC voltages can be driven onto these components without causing current to flow between them. In one embodiment, the dielectric 310 is an oxide such as hafnium oxide or silicon dioxide. In one embodiment, the dielectric 310 is made from the same material as the gate dielectric 305. Moreover, the thickness of the dielectric 310 may range between 5-20 angstroms. In one embodiment, the thickness of the dielectric 310 is on the same order of magnitude as the thickness of the gate dielectric 305 which may maximize capacitance between the structures forming the decoupling capacitor.

FIG. 3B illustrates the cross section of the decoupling capacitor indicated by B-B in FIG. 2. The decoupling capacitor includes spacers 315 which are used in finFETs to control the gate capacitance between the gates 210B, C and the fin 215C. However, since the decoupling capacitor is not used to perform switching logic, these spacers 315 may be omitted. Stated differently, in the decoupling capacitor, the gates 210B, 210C and fin 215C are driven to the same voltage, and thus, there is no capacitance between these structures.

This view illustrates that the dielectric 310 is between the gates 210B, C and the fin 215C to electrically insulate these components from the conductor 225. In this manner, the conductor 225 forms one "plate" of the decoupling capacitor, while the gates 210B, C and fin 215C combine to form a second "plate."

FIG. 3C illustrates the cross section of the finFET indicated by C-C in FIG. 2. Unlike in the portions of the decoupling capacitor shown in FIGS. 3A and 3B, the finFET is not covered in a conductive material. Instead, the exposed portions of the gate 210D, fin 215F, and contact 255C may be covered with a dielectric material which may form the substrate for additional processing layers—e.g., metal routing layers.

The contact 255C establishes a direct electrical connection to the fin 215F. In this example, the contact 255C is coupled to a voltage rail for driving a DC voltage on the portion of the fin 215F to the right of the gates 210D. By controlling the voltage of the gate 210D, the finFET uses the gate capacitance between the gate 210D and the fin 215F to open or close a conductive channel as described above. Unlike in the decoupling capacitor shown in FIGS. 3A and 3B, the finFET may drive different voltages on the gate 210D and fin 215F, and thus, the gate 210D, gate dielectric 305 and underlying portion of the fin 215F generate a gate capacitor. The spacers 315 may be used to control the value of the gate capacitance and ensure the gate 210D does not inadvertently contact the fin 215F.

Although not shown in FIG. 2, a decoupling capacitor may also be formed using the dummy gate 220. Like is shown in FIG. 3B, the dielectric 310 may also be deposited over the dummy gate 220. Then, the conductor 225 can be deposited over the dielectric 310. The dummy gate 220 and the conductor 225 can be connected to different voltage rails to form additional on-chip decoupling capacitances between the voltage rails 270, 280.

Figure 4A:
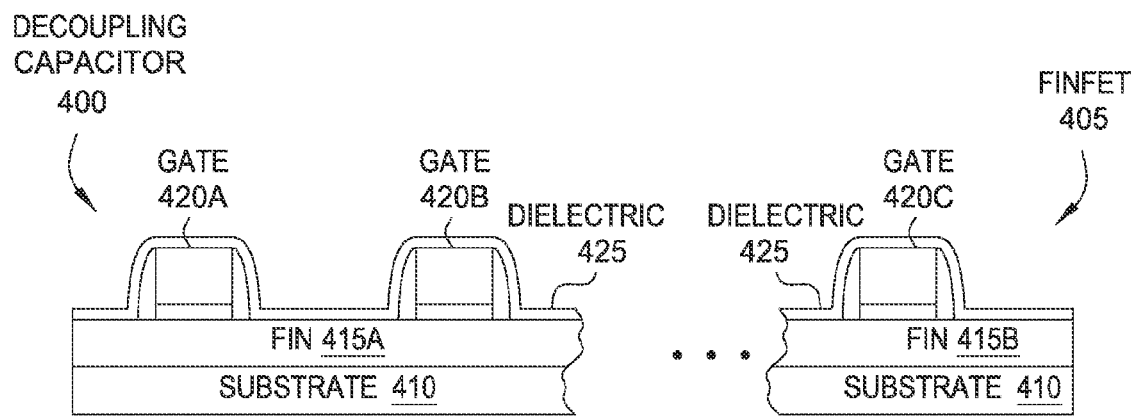
FIGS. 4A-4F illustrate forming a decoupling capacitor using a fin structure, according to one embodiment.

FIGS. 4A-4F illustrate forming a decoupling capacitor using a fin structure, according to one embodiment. FIG. 4A illustrates a side view of a decoupling capacitor 400 being processed in parallel with a finFET 405 on a common substrate 410. That is, the decoupling capacitor 400 and the finFET 405 may be formed on a same layer on the substrate 410. For example, the capacitor 400 and finFET 405 may be part of the same semiconductor chip. Although not illustrated, the gates 420, fins 415, gate oxides, and dielectric 425 may be disposed on the substrate 410 using the same steps. In one embodiment, the fins 415A, B may have been fabricated using the same disposition, etching, and/or doping steps. Additional steps may have also been used to fabricate the gate dielectrics, the gates 420, and dielectric 425. In other embodiments, however, some of the process steps may be different for the decoupling capacitor 400 and the finFET 405. For example, the gate dielectrics may be omitted for the capacitor 400. Alternatively, some of the doping steps performed on the fin 415B in the finFET 405 may not be performed on the fin 415A in the decoupling capacitor 400.

Figure 4B:
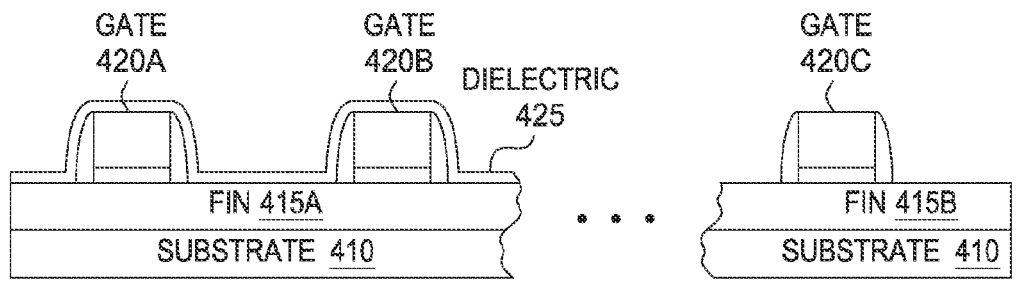

FIG. 4B illustrates selectively removing the dielectric 425 from the portion of the substrate 410 that includes the finFET 405. For example, a resist material may be deposited and patterned to exposes the finFET 405 during an etching step which removes the dielectric 425. In contrast, the dielectric 425 remains on the portion of the substrate 410 containing the decoupling capacitor 400 since the dielectric 425 (e.g., hafnium oxide or silicon dioxide) serves as the insulator for the capacitor 400.

Figure 4C:
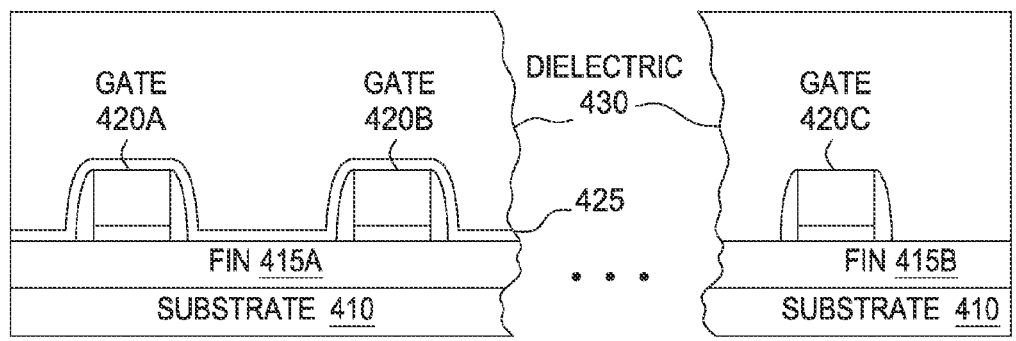

FIG. 4C illustrates disposing a dielectric material 430 onto both the decoupling capacitor 400 and the finFET 405. The thickness of the dielectric material 430 may be several thousands of angstroms. Moreover, after depositing the dielectric material 430, the material 430 may be planarized but still leave a large portion of the material 430 (e.g., greater than 500 angstroms in thickness) over the components in the decoupling capacitor 400 and finFET 405.

In one embodiment, the dielectric material 430 is different than the material of dielectric 425. In one embodiment, the dielectric layer 425 acts as an etch stop when removing the dielectric material 430. Stated differently, the dielectric 430 may be removed using a process (e.g., reactive ion etching) that does not affect the material of the dielectric layer 425.

Figure 4D:
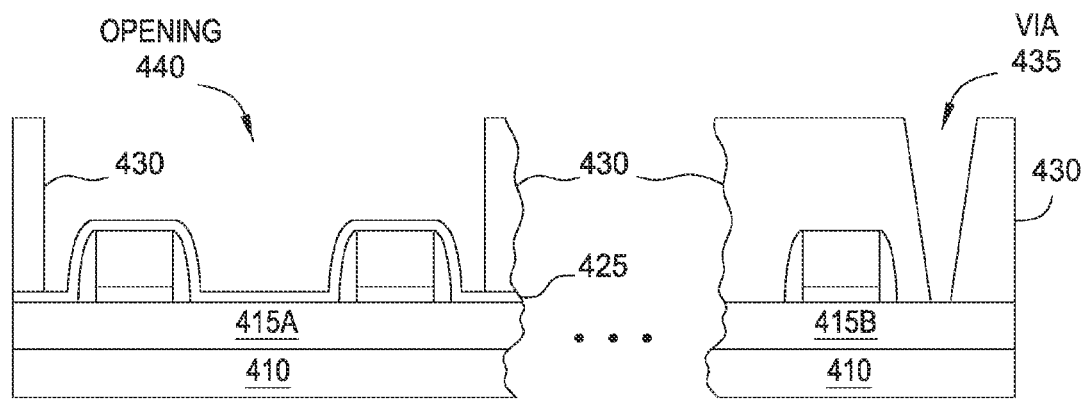

FIG. 4D illustrates etching the dielectric material 430 in order to provide an opening 440 which exposes the dielectric layer 425. For example, a mask may be used to pattern resist over the dielectric material 430. The dielectric material 430 would be exposed in the areas where it is desired to remove the material 430 while the remaining portions of the dielectric material 430 remains covered by the resist. While etching the dielectric material 430 on top of the gates and fins in the decoupling capacitor 400 to form an opening 440, a portion of the dielectric 430 over the finFET 400 is removed to form via 435 which extends to the fin 415B. Thus, the opening 440 and via 435 can be formed in parallel—i.e., during the same dielectric removal process.

Figure 4E:
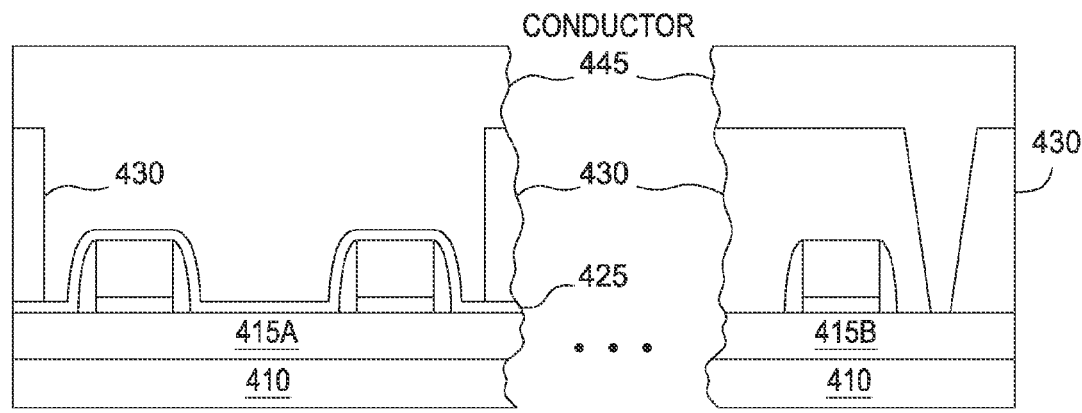

FIG. 4E illustrates depositing a conductor 445 over the decoupling capacitor 400 and the finFET 405. As shown, the conductor 445 (which may be the same material as the conductor 225 illustrated in FIG. 2) fills in the opening 440 and via 435. Specifically, the dielectric 425 electrically separates the conductor 445 from the gates and fin in the decoupling capacitor 400. However, in the finFET 400, the conductor 445 extends down to make direct contact to the fin 415B. Although not shown, the steps in FIGS. 4C-4E may also be used to form contacts to other components in the finFET 405 such as the gate 420C (or other fins in the finFET 405) in parallel with forming the conductor 445 on the decoupling capacitor 400.

Figure 4F:
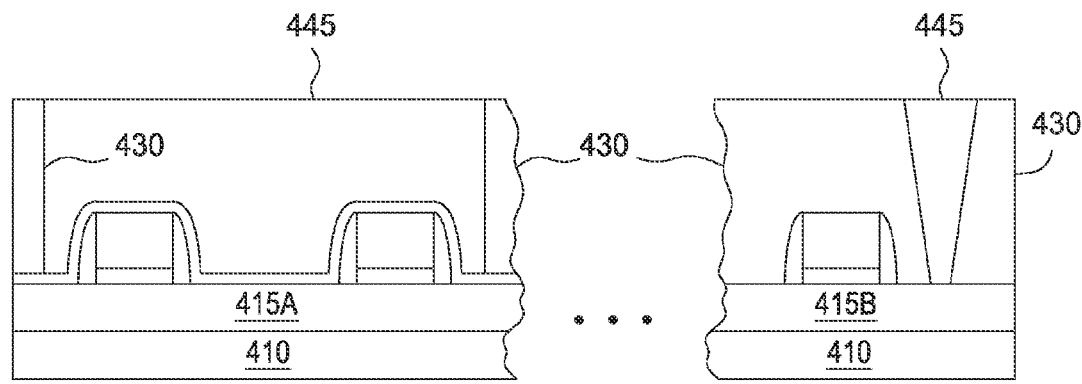

FIG. 4F illustrates removing a portion of the conductor 445. For example, a polishing process may be used to remove the top portion of the conductor until the dielectric 430 is reached. The remaining portion of the conductor 445 in the decoupling capacitor 400 forms one plate of the capacitor while the gates and fin form the other plate. However, in the finFET 405, the conductor 445 forms a contact (e.g., contacts 255 in FIG. 2) for driving or receiving voltages from the fin 415B. In one embodiment, later processing steps may be used to connect the conductor 445 in the decoupling capacitor 400 and the finFET 405 to a voltage rail.

Moreover, although not shown here, while forming the via 435 at FIG. 4D, other vias may have been formed that expose the gates 420A, B and fin 415A in the decoupling capacitor so that contacts are formed in the later processing steps shown in FIGS. 4E and 4F when the conductor 445 is deposited and planarized. These contacts can then be coupled to voltage rails in order to drive a DC voltage onto the fin 415A and gates 420A, B.

Figure 5A:
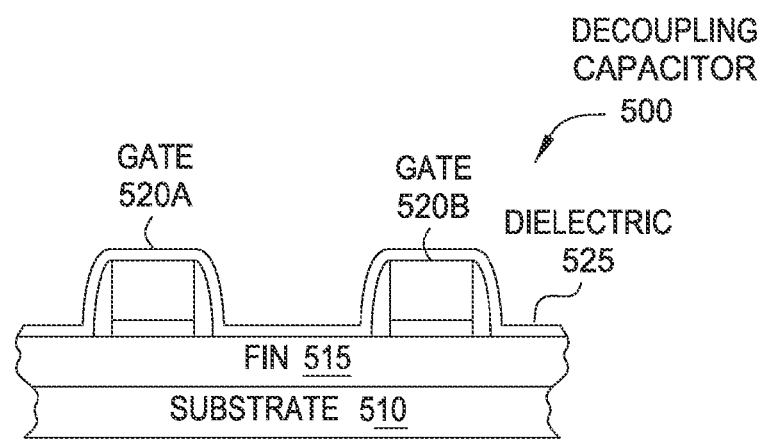
FIGS. 5A-5C illustrate forming a decoupling capacitor using a fin structure, according to one embodiment.
Figure 5B:
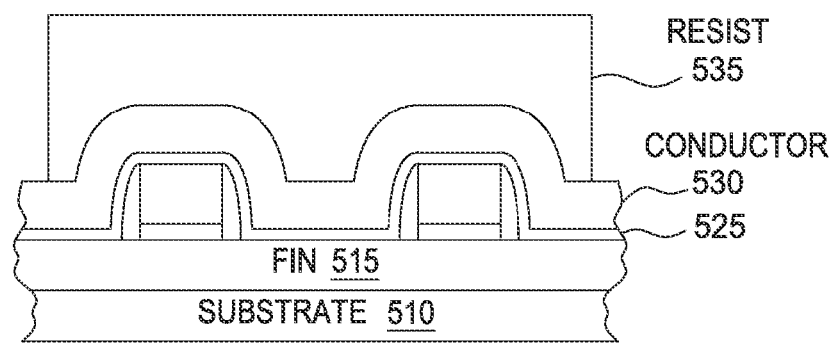
Figure 5C:
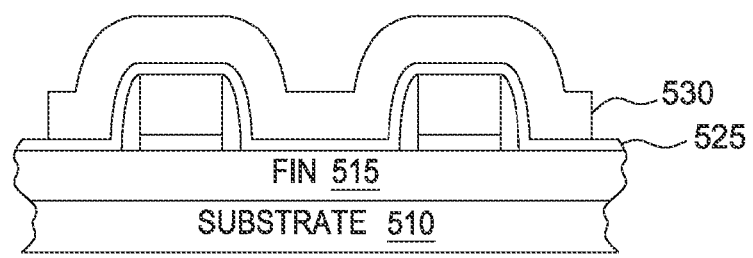

FIGS. 5A-5C illustrate forming a decoupling capacitor 500 using a fin structure, according to one embodiment. Although not shown in FIG. 5A, the decoupling capacitor 500 may be formed on a same layer of a substrate 510 as a finFET. For example, the capacitor 500 and finFET may be part of the same semiconductor chip. In one embodiment, the fins and gates in the decoupling capacitor 500 and the finFET may have been fabricated using the same disposition, etching, and/or doping steps. In other embodiments, however, some of the process steps for performing these steps may be different for the decoupling capacitor 500 and the finFET.

Unlike in FIG. 4C where the dielectric 430 is first deposited on the dielectric layer 425 before the conductor 445 is deposited, in FIG. 5B a conductor 530 is deposited directly onto the dielectric 525. In one embodiment, the conductor 530 is deposited across the entire chip in a conformal manner. Moreover, a resist 535 is deposited and patterned onto the conductor 530. In one example, the resist 535 may be placed on the chip in all the locations where it is desired to keep the conductor 530—e.g., on other decoupling capacitors. However, at locations that include finFETs (or other logic), the conductor 530 may remain uncovered.

In FIG. 5C, the conductor 530 is selectively removed from the chip. In this example, the conductor 530 is etched off the chip at the locations that are not covered by the photoresist. Moreover, the dielectric layer 525 may serve as an etch stop for the process used to remove the conductor 530. In later steps, another dielectric material may be deposited over the conductor 530 and the dielectric 525. This material can then be planarized to generate a suitable substrate for adding additional layers on the chip such as a metal network for the voltage rails, gate signals, output signals, and the like.

In one embodiment, the process steps shown in FIGS. 5A-5C may not be used to generate features in neighboring finFETs. Stated differently, unlike in FIGS. 4C-4F where the same processing steps are used to both pattern the conductor 445 onto the decoupling capacitor 400 and the conductive contact to the fin 415B in the finFET 405, here the conductor 530 may not be used to form a structure on the finFETs. Although process illustrated in FIG. 5A-5C may add additional steps to fabricating the chip, these steps may be cheaper since, for example, a wet etch or plasma etch can be used to selectively remove the conductor 530. Moreover, using different fabrication steps to deposit the conductor 530 in the decoupling capacitor 500 may be preferred if the type of conductor used in the capacitor 500 is different than the type of conductor used to form the contacts in the finFET. For example, the conductor 530 may be tungsten while the contacts in the finFETs are formed from copper.

In one embodiment, after patterning the conductor 530, a thick layer of dielectric material (e.g., greater than 1000 angstroms) is deposited onto the chip. Once planarized, a damascene process can be used to create the contacts to the fins, gates, and the conductor 530. A metal network can then be deposited on top of the decoupling capacitor and finFETs in order to couple these components to the power sources driving the voltage rails and other signals.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A decoupling capacitor, comprising:
   a fin disposed on a substrate, wherein the fin extends in a first direction on the substrate;
   a gate disposed on the substrate, wherein the gate extends in a second direction on the substrate substantially perpendicular to the first direction, wherein at least a portion of the fin is disposed between the gate and the substrate, and wherein the fin and gate are both coupled to a first DC voltage rail;
   a conductor coupled to a second DC voltage rail, wherein the fin and gate are both disposed between the conductor and the substrate; and
   a dielectric layer electrically insulating both the gate and the fin from the conductor.

2. The decoupling capacitor of claim 1, wherein a lower surface of the dielectric layer facing the substrate directly contacts both the fin and the gate.

3. The decoupling capacitor of claim 2, wherein an upper surface of the dielectric layer directly contacts the conductor, wherein the upper surface is opposite the lower surface.

4. The decoupling capacitor of claim 2, wherein a thickness of the dielectric layer is between 5 and 50 angstroms.

5. The decoupling capacitor of claim 1, wherein a gate dielectric is disposed between the fin and the gate.

6. The decoupling capacitor of claim 1, further comprising:
   a plurality of fins extending in the first direction; and
   a plurality of gates extending in the second direction, wherein each of the gates overlaps at least a portion of each of the fins relative to a direction perpendicular to the substrate, wherein each of the fins and each of the gates is directly coupled to the first DC voltage rail.

7. The decoupling capacitor of claim 6, wherein the dielectric layer and the conductor each overlap both the fins and the gates relative to the direction perpendicular to the substrate.

8. A method, comprising:
   forming a dielectric layer on a substrate, wherein a gate and fin are disposed between the dielectric layer and the substrate, wherein at least a portion of the fin is disposed between the gate and the substrate, and wherein the fin extends in a first direction and the gate extends in a second direction substantially perpendicular to the first direction;
   forming a conductor on the substrate such that the fin and gate are both disposed between the conductor and the substrate, wherein the dielectric layer electrically insulates both the gate and the fin from the conductor;
   coupling both the fin and the gate to a first DC voltage rail; and
   coupling the conductor to a second DC voltage rail.

9. The method of claim 8, wherein a lower surface of the dielectric layer facing the substrate directly contacts both the fin and the gate, and wherein an upper surface of the dielectric layer directly contacts the conductor, wherein the upper surface is opposite the lower surface.

10. The method of claim 9, further comprising:
    forming a fin field effect transistor (finFET) on the substrate, the finFET comprising a first fin and a first gate overlapping the first fin;
    forming a conductive contact to at least one of the first fin and first gate in parallel with forming the conductor, wherein the conductive contact and the conductor comprise a common material.

11. The method of claim 10, wherein forming the conductive contact comprises:
    selectively removing a portion of the dielectric layer disposed on the finFET;
    depositing, before forming the conductor, dielectric material on the finFET and an unremoved portion of the dielectric layer;
    etching the dielectric material to form an opening over the unremoved portion of the dielectric layer and a via over the first fin in the finFET; and
    depositing the conductor into the opening and the via.

12. The method of claim 8, further comprising:
    forming a gate dielectric on the substrate, wherein the gate dielectric is between the fin and the gate.

13. The method of claim 8, further comprising:
    forming a plurality of fins extending in the first direction on the substrate;

forming a plurality of gates extending in the second direction on the substrate, wherein each of the gates overlaps at least a portion of each of the fins relative to a direction perpendicular to the substrate, wherein each of the fins and each of the gates is directly coupled to the first DC voltage rail.

14. The method of claim 13, wherein the dielectric layer and the conductor each overlap both the fins and the gates relative to the direction perpendicular to the substrate.

15. The method of claim 8, wherein forming the conductor on the substrate comprises:
depositing the conductor directly onto the dielectric layer;
patterning resist over a first portion of the conductor; and
removing a second portion of the conductor that is not covered by the resist.

16. An integrated circuit, comprising:
a substrate;
a decoupling capacitor disposed on the substrate, comprising:
a first fin disposed on the substrate, wherein the first fin extends in a first direction on the substrate,
a first gate disposed on the substrate, wherein the first gate extends in a second direction on the substrate substantially perpendicular to the first direction, wherein at least a portion of the first fin is disposed between the first gate and the substrate, wherein the first fin and first gate are both coupled to a first DC voltage rail,
a conductor coupled to a second DC voltage rail, wherein the first fin and first gate are both disposed between the conductor and the substrate, and
a dielectric layer electrically insulating both the first gate and the first fin from the conductor; and
a fin field-effect transistor (finFET), comprising:
a second fin, and
a second gate, wherein the second gate is disposed over a portion of the second fin in order to selectively activate a conductive channel in the portion of the second fin in response to a time-varying gate signal.

17. The integrated circuit of claim 16, wherein a lower surface of the dielectric layer facing the substrate directly contacts both the first fin and the first gate, and wherein an upper surface of the dielectric layer directly contacts the conductor, wherein the upper surface is opposite the lower surface.

18. The integrated circuit of claim 17, wherein the dielectric layer does not extend into the finFET.

19. The integrated circuit of claim 16, wherein the first fin and second fin are disposed on a common plane on the substrate, wherein at least a portion of the first gate and second gate are disposed on the common plane of the substrate.

20. The integrated circuit of claim 16, further comprising:
a conductive contact in the finFET directly contacting one of the second fin and the second gate, wherein the conductive contact comprises a same material as the conductor.

* * * * *